United States Patent
Choi et al.

(10) Patent No.: US 10,644,276 B2
(45) Date of Patent: May 5, 2020

(54) BATTERY MODULE

(71) Applicant: LG CHEM, LTD., Seoul (KR)

(72) Inventors: Yong-Joon Choi, Daejeon (KR);
Tae-Young Kang, Daejeon (KR);
Do-Hyeon Kim, Daejeon (KR);
Hwa-Joong Kim, Daejeon (KR);
Duck-Hee Moon, Daejeon (KR);
Jun-Yeob Seong, Daejeon (KR);
Sung-Chun Yu, Daejeon (KR)

(73) Assignee: LG CHEM, LTD., Seoul (KR)

( * ) Notice: Subject to any disclaimer, the term of this patent is extended or adjusted under 35 U.S.C. 154(b) by 235 days.

(21) Appl. No.: 15/759,043

(22) PCT Filed: Jan. 26, 2017

(86) PCT No.: PCT/KR2017/000977
§ 371 (c)(1),
(2) Date: Mar. 9, 2018

(87) PCT Pub. No.: WO2017/138709
PCT Pub. Date: Aug. 17, 2017

(65) Prior Publication Data
US 2019/0189979 A1  Jun. 20, 2019

(30) Foreign Application Priority Data

Feb. 11, 2016  (KR) .................. 10-2016-0015760

(51) Int. Cl.
*H01M 10/04* (2006.01)
*H01M 2/10* (2006.01)
(Continued)

(52) U.S. Cl.
CPC .......... *H01M 2/1016* (2013.01); *G01R 31/36* (2013.01); *H01M 2/10* (2013.01); *H01M 2/1077* (2013.01);
(Continued)

(58) Field of Classification Search
None
See application file for complete search history.

(56) References Cited

U.S. PATENT DOCUMENTS

| 2007/0126396 A1 | 6/2007 | Yang |
| 2008/0124617 A1 | 5/2008 | Bjork |

(Continued)

FOREIGN PATENT DOCUMENTS

| JP | 2012-212605 A | 11/2012 |
| JP | 2015-56342 A | 3/2015 |

(Continued)

OTHER PUBLICATIONS

Inernational Search Report (PCT/ISA/210) issued in PCT/KR2017/000977, dated May 22, 2017.
(Continued)

*Primary Examiner* — Haroon S. Sheikh
(74) *Attorney, Agent, or Firm* — Birch, Stewart, Kolasch & Birch, LLP

(57) ABSTRACT

The present disclosure provides a battery module capable of stably maintaining contact of electrode leads while having a simple structure and high assemblability. The battery module of the present disclosure includes: a cell assembly including a plurality of secondary batteries and a plurality of cartridges, the secondary batteries being vertically arranged and including electrode leads, the cartridges being vertically stacked to accommodate the secondary batteries in an inner space thereof; and a sensing assembly mounted on a front side of the cell assembly and including an insulation housing formed of an electrically insulative material and a sensing bus bar formed of an electrically conductive material, the sensing assembly being coupled to the electrode leads to sense voltages of the secondary batteries, wherein the insulation housing includes a plurality of penetration holes vertically spaced apart from each other to receive the elec- (Continued)

trode leads therethrough, and a plurality of housing slant portions arranged in the penetration holes and sloped at a predetermined angle from a horizontal direction.

16 Claims, 10 Drawing Sheets

(51) Int. Cl.
    *H01M 2/30*     (2006.01)
    *G01R 31/36*     (2020.01)
    *H01M 2/20*     (2006.01)
    *H01M 10/48*     (2006.01)

(52) U.S. Cl.
    CPC ............ *H01M 2/20* (2013.01); *H01M 2/206* (2013.01); *H01M 2/30* (2013.01); *H01M 10/0472* (2013.01); *H01M 10/482* (2013.01); *H01M 2220/20* (2013.01)

(56) References Cited

U.S. PATENT DOCUMENTS

| | | |
|---|---|---|
| 2013/0149571 A1 | 6/2013 | Lee et al. |
| 2014/0023909 A1 | 1/2014 | Suzuki |
| 2016/0233476 A1 | 8/2016 | Okamoto et al. |
| 2016/0248070 A1 | 8/2016 | Ahn |
| 2016/0268652 A1 | 9/2016 | Eom et al. |

FOREIGN PATENT DOCUMENTS

| | | |
|---|---|---|
| KR | 10-2007-0057344 A | 6/2007 |
| KR | 10-1403930 B1 | 7/2014 |
| KR | 10-2015-0050314 A | 5/2015 |
| KR | 10-2015-0062743 A | 6/2015 |

OTHER PUBLICATIONS

English translation of Written Opinion of the International Searching Authority for Appl. No. PCT/KR2017/000977 dated May 22, 2017.

BATTERY MODULE

TECHNICAL FIELD

The present application claims priority to Korean Patent Application No. 10-2016-0015760 filed on Feb. 11, 2016 in the Republic of Korea, the disclosure of which is incorporated herein by reference.

The present disclosure relates to a battery module, and more particularly, to a battery module capable of stably maintaining contact of electrode leads while having a simple structure and high assemblability, and a battery pack and an automobile including the battery module.

BACKGROUND ART

In recent years, there has been increasing demand for portable electronic products such as laptop computers, smartphones, and smartwatches, and the development of devices such as energy storage batteries, robots, and satellites has begun in earnest. Along with this, research into high-performance secondary batteries that can be repeatedly charged and discharged has been more actively conducted.

Examples of currently commercialized secondary batteries include nickel-cadmium batteries, nickel-metal hydride batteries, nickel-zinc batteries, and lithium secondary batteries. Among such various secondary batteries, lithium secondary batteries are freely rechargeable because of having substantially no memory effect compared with nickel-based secondary batteries, and have a very low self-discharge rate and high energy density. Owing to these merits, there has been high interest in lithium secondary batteries.

In general, lithium secondary batteries use a lithium-based oxide as a positive electrode active material and a carbonaceous material as a negative electrode active material. A lithium secondary battery may include: an electrode assembly in which a positive electrode plate coated with such a positive electrode active material and a negative electrode plate coated with such a negative electrode active material are disposed with a separator therebetween; and a case, that is, a battery case in which the electrode assembly and an electrolytic solution are sealed.

In general, according to case types, lithium secondary batteries may be classified into a can type in which an electrode assembly is accommodated in a metal can, and a pouch type in which an electrode assembly is accommodated in a pouch formed of an aluminum laminate sheet.

In recent years, secondary batteries have been widely used not only in small-sized devices such as portable electronic devices, but also in medium to large-sized devices such as automobiles or power storage devices. In particular, along with the depletion of carbon energy and the increasing interest in the environment, there has been worldwide interest in hybrid vehicles and electric vehicles in countries such as the USA, Europe, Japan, and Korea. The core component of such a hybrid or electric vehicle is a battery pack providing driving power to a vehicle motor. Since hybrid or electric vehicles can have driving power via charging and discharging of battery packs, hybrid or electric vehicles have high fuel efficiency and emit no pollutants or less pollutants compared to vehicles only using engines, and thus the use of hybrid or electric vehicles has been gradually markedly increased.

Most battery packs, particularly, middle to large-sized battery packs for hybrid vehicles, electric vehicles, or energy storage systems (ESSs) include a plurality of secondary batteries, and the plurality of secondary batteries are connected in series and/or parallel with each other for high capacity and power. In addition, pouch-type secondary batteries are generally used in middle to large-sized battery packs because the pouch-type secondary batteries are easy to stack and are light, and a large number of pouch-type secondary batteries can be included in one battery pack.

Electrical connection between pouch-type secondary batteries are generally achieved by bringing electrode leads into direct contact with each other. In this case, electrode leads having the same polarity are connected to each other so as to connect secondary batteries in parallel to each other, or electrode leads having different polarities are connected to each other so as to connect secondary batteries in series to each other.

However, if electrode leads that should not be connected to each other are connected, an internal short circuit may be formed, damaging a battery pack and even causing fire or explosion. On the other hand, if electrode leads that should be connected to each other are separated from each other, power may not be properly supplied from a battery module, causing a power insensitive phenomenon or decreasing the capacity or power of the battery module. As described above, if a phenomenon such as a power insensitive phenomenon occurs, a device including a battery module such as an automobile may not operate, and in this case, a big accident may occur.

Therefore, it is required to stably maintain contact between electrode leads in an intended manner without unintended contact or separation. In addition, battery modules for automobiles may be frequently exposed to vibrations or shocks, and thus it has been constantly required to develop a battery module capable of stably maintaining connection between electrode leads even when the battery module is vibrated or impacted.

In addition, it is required to guarantee the assemblability of battery modules in addition to stably maintaining connection between electrode leads of the battery modules. For example, if it is very difficult to assemble battery modules even though connection between electrode leads is stable, the productivity of the battery modules may decrease, and the possibility of defects in the battery modules may increase.

In particular, a battery module may include a sensing bus bar to sense voltages of secondary batteries, and to this end, the sensing bus bar may have to be in contact with an electrode lead. In this case, an electrode lead may have to be in contact with another electrode lead and a sensing bus bar as well. Therefore, when a battery module is assembled, a structure imparting high assemblability to a connection portion between an electrode lead and a sensing bus bar may be required to facilitate connection between electrode leads and connection between an electrode lead and a sensing bus bar. Furthermore, a coupling process such as a welding process may be performed so as to stably maintain connection between a plurality of electrode leads and a sensing bus bar, and in this case, a module structure having high weldability is preferred.

DISCLOSURE

Technical Problem

The present disclosure is designed to solve the problems of the related art, and therefore the present disclosure is directed to providing a battery module capable of stably maintaining connection between electrode leads and having improved assemblability and processability, and a battery pack and an automobile including the battery module.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

To achieve the above-described objectives, a battery module of the present disclosure includes: a cell assembly including a plurality of secondary batteries and a plurality of cartridges, the secondary batteries being vertically arranged and including electrode leads, the cartridges being vertically stacked to accommodate the secondary batteries in an inner space thereof; and a sensing assembly mounted on a front side of the cell assembly and including an insulation housing formed of an electrically insulative material and a sensing bus bar formed of an electrically conductive material, the sensing assembly being coupled to the electrode leads so as to sense voltages of the secondary batteries, wherein the insulation housing includes a plurality of penetration holes vertically spaced apart from each other to allow the electrode leads to penetrate therethrough, and a plurality of housing slant portions arranged in the penetration holes and sloped at a predetermined angle from a horizontal direction.

Here, the housing slant portions may have a height decreasing in an inward direction.

In addition, the insulation housing may further include outer horizontal portions extending from lower ends of the housing slant portions in an outward horizontal direction.

In addition, the outer horizontal portions may protrude outward with respect to the sensing bus bar.

In addition, the sensing bus bar may be located outside the housing slant portions to form an empty space between the sensing bus bar and the housing slant portions.

In addition, the plurality of penetration holes, the plurality of housing slant portions, and a plurality of sensing bus bars are vertically arranged in two columns in a horizontal direction.

In addition, the insulation housing may further include an inner horizontal portion extending from a lower end of each of the housing slant portions such that an inner end portion of the inner horizontal portion may extend in an inward horizontal direction.

In addition, the cartridges may include cartridge slant portions formed on outer end portions of the cartridges and sloped at a predetermined angle from the horizontal direction.

In addition, to achieve the above-described objectives, a battery pack of the present disclosure includes the battery module of the present disclosure.

In addition, to achieve the above-described objectives, an automobile of the present disclosure includes the battery module of the present disclosure.

Advantageous Effects

According to an effect of the present disclosure, connection between the electrode leads of the secondary batteries in the battery module may be stably maintained.

In particular, according to an aspect of the present disclosure, electrode leads that should not be connected to each other may not be unintentionally brought into contact with each other. Therefore, according to the aspect of the present disclosure, an internal short circuit may not be caused by improper contact between electrode leads, and thus the battery pack may have improved safety and may be prevented from catching on fire or exploding.

In addition, according to another aspect of the present disclosure, electrode leads that should be connected to each other may not be unintentionally separated from each other. Therefore, according to the aspect of the present disclosure, a power insensitive phenomenon or a decrease in power or capacity may not be caused by improper separation of electrode leads.

In addition, according to another effect of the present disclosure, while stably maintaining connection between the electrode leads of the secondary batteries as described above, the battery module may be prevented from having a complex structure, poor processability, or poor assemblability.

In particular, according to an aspect of the present disclosure, connection between the electrode leads may be stably maintained using the sensing assembly and/or the cartridges without using additional components.

In addition, according to another aspect of the present disclosure, the cell assembly and the sensing assembly may be more easily assembled. In addition, when the sensing assembly is coupled to the cell assembly, the electrode leads of the cell assembly may be easily guided into the holes of the sensing assembly, and the electrode leads may be easily brought into contact with each other.

Therefore, according to these aspects of the present disclosure, the battery module may not have a complex structure, poor assemblability, and poor processability, and the manufacturing costs or time of the battery module may not be increased.

DESCRIPTION OF DRAWINGS

The accompanying drawings illustrate preferred embodiments of the present disclosure and together with the foregoing disclosure, serve to provide further understanding of the technical features of the present disclosure, and thus, the present disclosure is not construed as being limited to the drawings.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
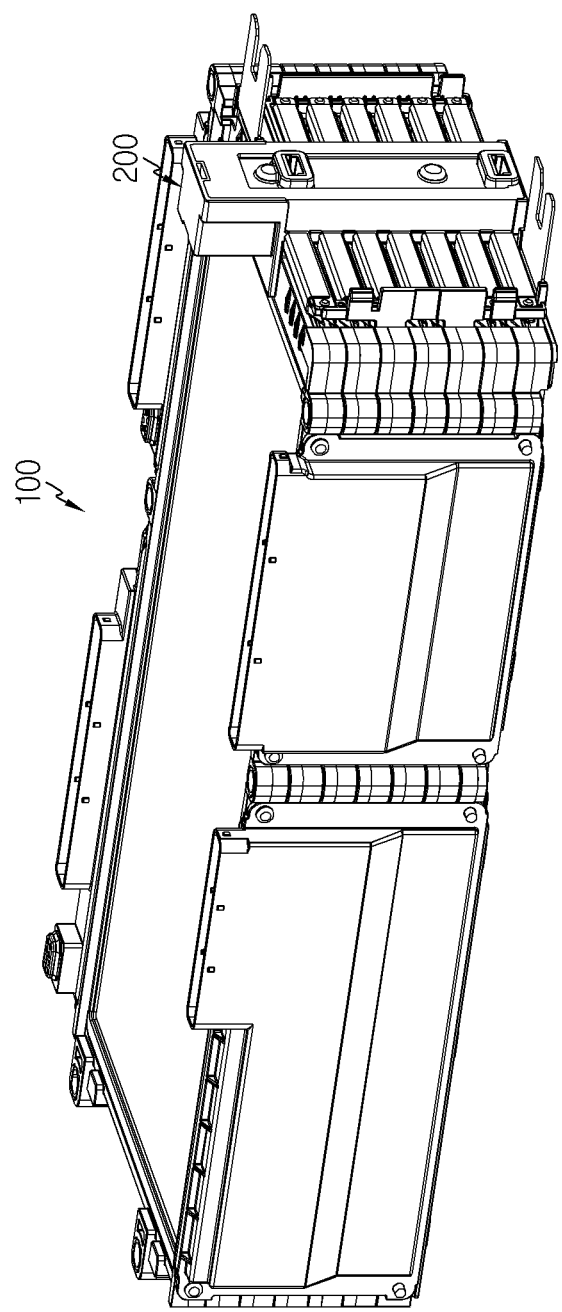
FIG. 1 is an assembled perspective view illustrating a structure of a battery module according to an embodiment of the present disclosure.
Figure 2:
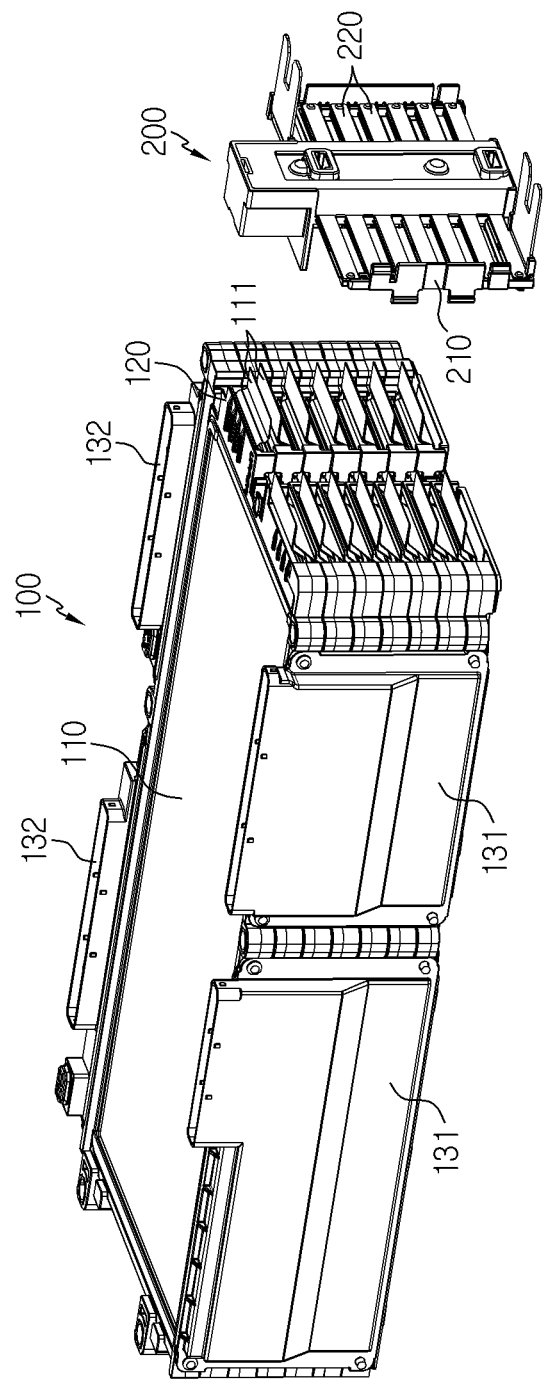
FIG. 2 is an exploded perspective view illustrating the structure shown in FIG. 1.

FIG. 1 is an assembled perspective view illustrating a structure of a battery module according to an embodiment of the present disclosure, and FIG. 2 is an exploded perspective view illustrating the structure shown in FIG. 1. In addition, FIG. 3 is a top view illustrating the structure shown in FIG. 1.

Figure 3:
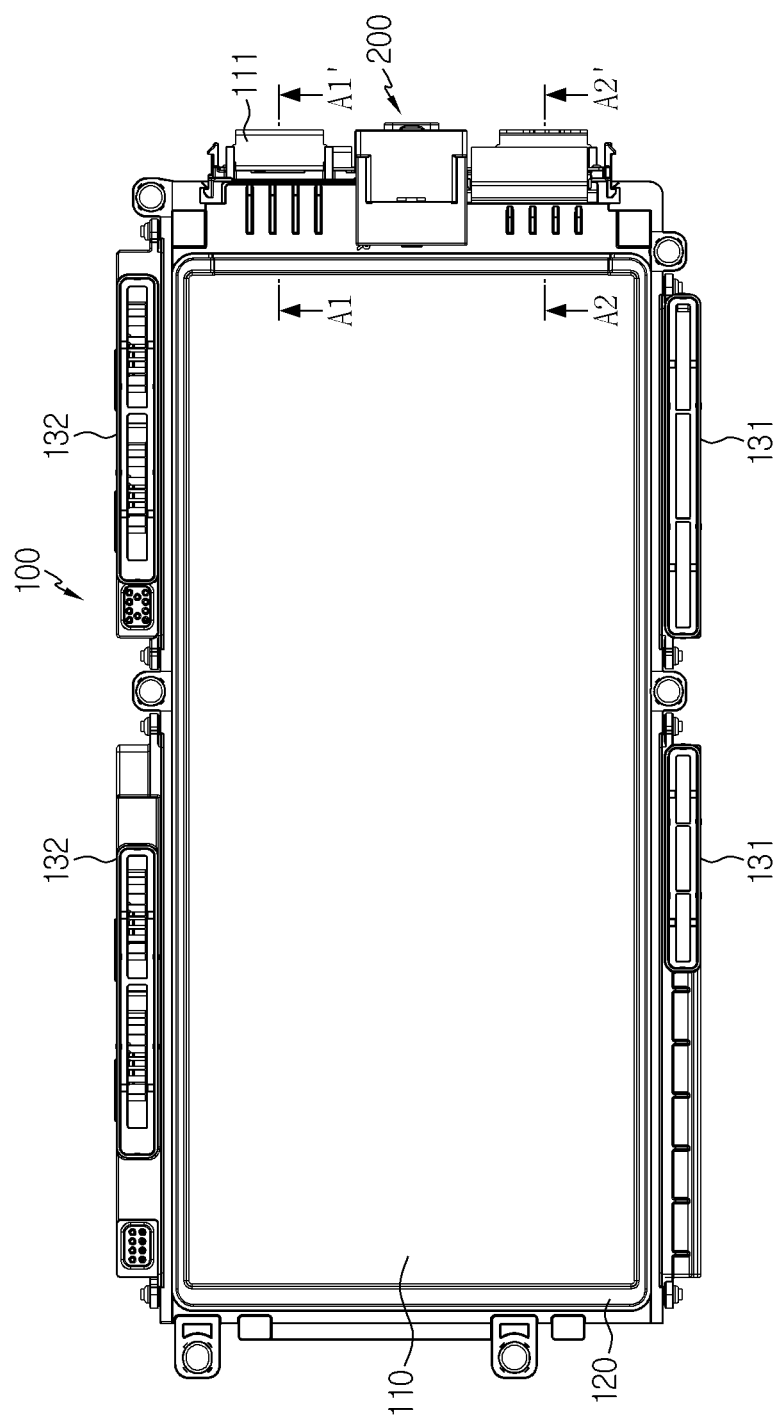
FIG. 3 is a top view illustrating the structure shown in FIG. 1.

Referring to FIGS. 1 to 3, the battery module of the present disclosure includes a cell assembly 100 and a sensing assembly 200.

The cell assembly 100 may include a plurality of secondary batteries 110. In particular, a plurality of pouch-type secondary batteries may be included in the cell assembly 100 as the secondary batteries 110. Each of the pouch-type secondary battery may include an electrode assembly, an electrolyte, and a pouch-type case.

The electrode assembly may be formed by arranging at least one positive electrode plate and at least one negative electrode plate with a separator therebetween. More specifically, examples of the electrode assembly includes a wound-type electrode assembly in which one positive electrode plate and one negative electrode plate are wound together with a separator, and a stacked-type electrode assembly in which a plurality of positive electrode plates and a plurality of negative electrode plates are alternately stacked with separators therebetween.

In addition, the pouch-type case may include an external insulating layer, a metal layer, and an internal adhesive layer. The pouch-type case may include a thin metal film such as a thin aluminum film for protecting internal components such as the electrode assembly and the electrolyte, complementing the electrochemical properties of the electrode assembly and the electrolyte, and guaranteeing heat dissipation. In addition, the thin aluminum film may be placed between insulating layers formed of an insulating material, so as to electrically insulate internal components of the secondary battery such as the electrode assembly and the electrolyte from other components located outside the secondary battery.

In particular, the pouch-type case may include two pouches, and a concave inner space may be formed in at least one of the two pouches. The electrode assembly may be accommodated in the inner space of the pouch. In addition, sealing portions may be provided on peripheral surfaces of the two pouches, and these sealing portions may be fused to each other to seal the inner space in which the electrode assembly is accommodated.

Each of the pouch-type secondary batteries may include an electrode lead 111, and the electrode lead 111 may include a positive electrode lead and a negative electrode lead. Here, as shown in the drawings, each electrode lead 111 has a plate shape protruding from the pouch-type case in a horizontally laid posture and may function as an electrode terminal of the secondary battery.

According to an aspect of the present disclosure, the battery module may include various pouch-type secondary batteries known at the time of filing the present application. The plurality of pouch-type secondary batteries 110 may be stacked in one direction, for example, in a vertical direction as shown in the drawings. In this case, each of the pouch-type secondary batteries 110 may be laid in parallel with the ground, that is, with wide surfaces thereof facing upward and downward, and the plurality of pouch-type secondary batteries 110 may be arranged in parallel with each other.

In addition, the cell assembly 100 may include a cartridge 120.

The cartridge 120 may accommodate a pouch-type secondary battery 110 in an inner space thereof, thereby protecting the pouch-type secondary battery 110 from external agents, guiding arrangement of pouch-type secondary battery 110, and preventing relative movement of a stacked assembly. For example, the cartridge 120 may include four unit frames connected to each other at ends thereof and formed of an insulative material such as a plastic material. As shown in FIG. 3, the cartridge 120 may have an approximately tetragonal ring shape. In general, the pouch-type secondary batteries 110 have an approximately tetragonal ring shape, and thus the cartridge 120 may have a tetragonal ring shape to surround outer portions of a pouch-type secondary battery 110. In this case, the unit frames of the cartridge 120 may be separately manufactured and then assembled together, or may be manufactured in one piece from the beginning. In the above-described structure, an accommodation portion of the cartridge 120 may be located in an inner empty space defined by the respectively unit frames. In addition, at least a portion of a sealing portion of the cartridge 120 may be located on each of the unit frames.

In addition, the cartridge 120 may be configured to be placed on top of another. For example, as shown in the drawings, cartridges 120 may be stacked in the same vertical direction as the direction in which the secondary batteries 110 are stacked. In addition, a pouch-type secondary battery 110 may be accommodated in an inner space formed by a stack of at least two cartridges 120.

In this case, stacking surfaces of the cartridges 120, that is, left and right surfaces of the cartridges 120 may have concave-convex structures corresponding to each other. According to the embodiment, owing to the concave-convex structures of the cartridges 120, the cartridges 120 may be more reliably coupled to and fixed to each other, and it may be easy to assemble the cartridges 120 because the concave-convex structures function as guides.

The sensing assembly 200 may be mounted on a front side of the cell assembly 100. Herein, the front side of the cell assembly 100 may refer to a side from which the electrode leads 111 of the cell assembly 100 protrude. For example, the front side of the cell assembly 100 may be a right side of the cell assembly 100 in FIG. 2. In addition, terms indicating directions such as front, rear, left, right, upper, and lower may vary relative to the position of an observer or the posture of an object. However, in the present specification, a side from which the electrode leads 111 protrude is referred to as a front side, and other directions such as front, rear, left, right, upper, and lower are denoted based on the front side for ease of description.

The sensing assembly 200 may be configured to be detachable from the cell assembly 100. For example, the sensing assembly 200 may include a hook protrusion, and the cell assembly 100 may include a corresponding hook recess, such that the sensing assembly 200 may be hook-coupled to the cell assembly 100.

In particular, the sensing assembly 200 may be coupled to the electrode leads 111 of the sensing assembly 200 to sense voltages of the secondary batteries 110. In particular, the sensing assembly 200 may be configured to sense a voltage between both ends of each of the secondary batteries 110 of the cell assembly 100.

Figure 4:
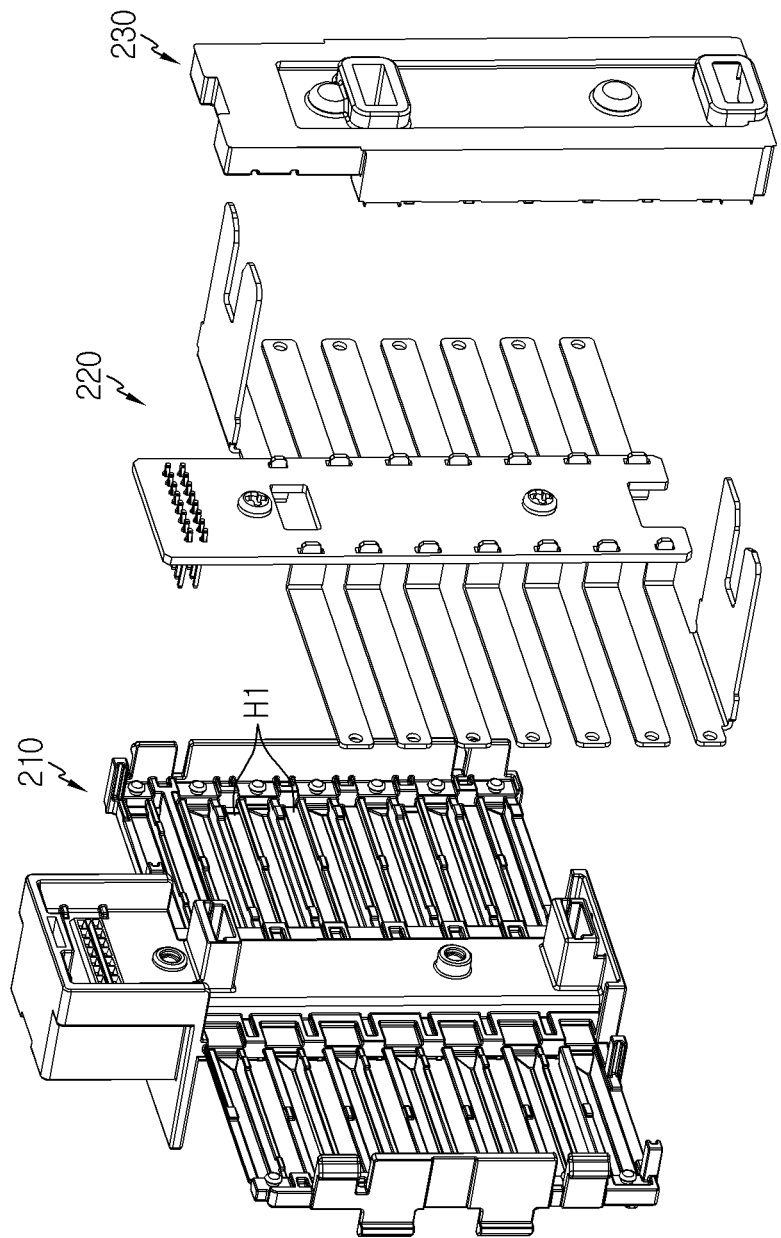
FIG. 4 is an exploded perspective view illustrating a sensing assembly shown in FIG. 1.
Figure 5:
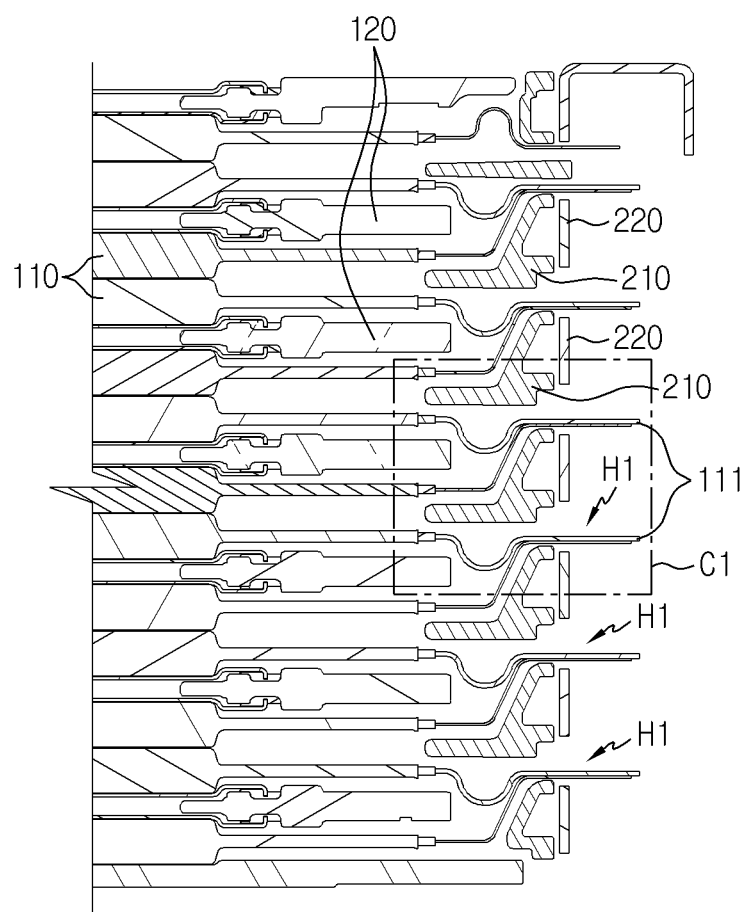
FIG. 5 is a cross-sectional view taken along line A1-A1' of FIG. 3.

FIG. 4 is an exploded perspective view illustrating the sensing assembly 200 shown in FIG. 1. In addition, FIG. 5 is a cross-sectional view taken along line A1-A1' of FIG. 3. However, FIG. 5 illustrates a state in which the electrode leads 111 are not in contact with a sensing bus bar 220 for ease of description.

As illustrated in FIGS. 4 and 5, the sensing assembly 200 may include the sensing bus bar 220 and an insulation housing 210.

The insulation housing 210 may be formed of an electrically insulative material. For example, the insulation housing 210 may be formed of a plastic material.

The sensing bus bar 220 is in contact with the electrode leads 111 to sense voltages of the electrode leads 111 and may form an electrical path through which the sensed voltages are transferred to other components such as a battery management system (BMS). To this end, the sensing bus bar 220 may be formed of an electrically conductive material like the electrode leads 111. For example, the sensing bus bar 220 may be formed of a metallic material such as copper or aluminum. The sensing bus bar 220 may be coupled to the insulation housing 210 by various methods. For example, the sensing bus bar 220 may be fastened to the insulation housing 210 using a fastening member such as a bolt or rivet. Alternatively, a fastening hole may be formed in the sensing bus bar 220, and a fastening protrusion may be formed on the insulation housing 210 to couple the sensing bus bar 220 to the insulation housing 210 by inserting the fastening protrusion to the fastening hole. In this case, after the fastening protrusion is inserted into the fastening hole, an outer end portion of the fastening protrusion may be pressed or heated to increase the thickness of the fastening protrusion and thus to fix the coupled state.

In addition, as illustrated in FIG. 4, the sensing assembly 200 may further include a cover 230 to cover at least a portion of the sensing bus bar 220. The cover 230 may be formed of an electrically insulative material such as a plastic material like the insulation housing 210 and may be placed on an outer side of the sensing bus bar 220. Therefore, the cover 230 may prevent at least a portion of the sensing bus bar 220 from being exposed to the outside and may guarantee electrical insulation. In addition, the cover 230 may be fixedly coupled to the insulation housing 210 or the sensing bus bar 220.

A penetration hole may be formed through the insulation housing 210 as indicated by H1 such that an electrode lead 111 of the cell assembly 100 may penetrate the insulation housing 210 in a direction from inside to outside. Here, the inside may refer to a center portion of the battery module, and the outside may refer to the outside of the battery module. For example, in the structure shown in FIG. 5, the inside may refer to left, and the outside may refer to right. In the present specification, the inside and outside may be distinguished in this manner unless otherwise specified.

A plurality of such penetration holes H1 may be formed in the insulation housing 210, and the plurality of penetration holes H1 may be vertically spaced apart from each other as shown in the drawings. In the cell assembly 100 of the battery module of the present disclosure, the pouch-type secondary batteries 110 may be vertically stacked in a laid-down manner, and thus the plurality of electrode leads 111 of the secondary batteries 110 may be vertically arranged. In addition, every two of the plurality of electrode leads 111 may be paired in contact with each other for electrical connection between the secondary batteries 110, and the respective pairs may be vertically arranged. Therefore, the respective pairs of the electrode leads 111 arranged in a vertical direction may pass through the penetration holes H1 of the insulation housing 210.

Particularly, in the sensing assembly 200 of the battery module of the present disclosure, the insulation housing 210 may have a slant portion. This will be described in more detail with reference to FIG. 6.

Figure 6:
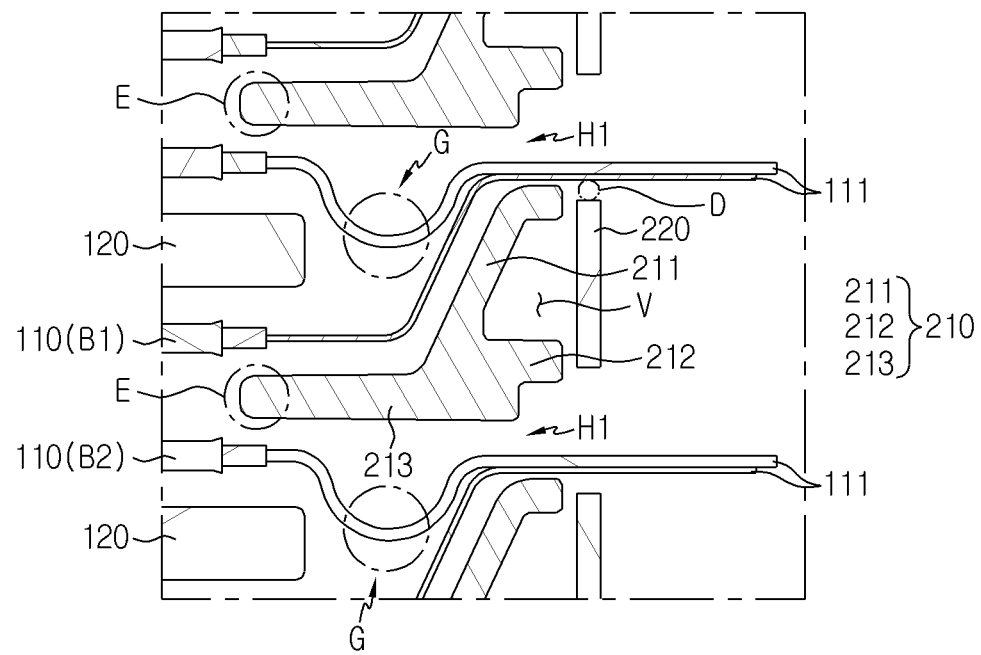
FIG. 6 is an enlarged view illustrating a portion C1 of FIG. 5.

FIG. 6 is an enlarged view illustrating a portion C1 of FIG. 5.

Referring to FIG. 6, a housing slant portion 211 may be formed inside a penetration hole in an inclined shape at a predetermined angle with a horizontal direction. For example, when a left-right horizontal direction in FIG. 6 is parallel with the ground, the housing slant portion 211 may have a slant surface forming an angle of about 60° to about 70° with the ground. However, the slant angle may be varied according to factors such as the shape of the sensing assembly 200 or the cell assembly 100, the shape of the electrode leads 111, or the number of the secondary batteries 110.

According to the structure in which the housing slant portion 211 is formed, when the sensing assembly 200 is assembled to the cell assembly 100, an electrode lead 111 of the cell assembly 100 may be easily guided to a penetration hole of the sensing assembly 200 along the housing slant portion 211 of the sensing assembly 200. Therefore, the assemblability and processability of the sensing assembly 200 and the cell assembly 100 may be improved.

In addition, according to this structure, the electrode lead 111 is easily inserted into the penetration hole, and thus the penetration hole is not required to have a large size. Therefore, introduction of external substances through the penetration hole may be easily prevented. In addition, two electrode leads 111 may be easily brought into contact with each other. In addition, since the electrode lead 111 is effectively prevented from moving inside the penetration hole, damage caused by the movement of the electrode lead 111 or separation of two electrode leads 111 may be prevented.

In particular, the height of the housing slant portion 211 may decrease in an inward direction. That is, in the structure shown in FIG. 6, the height of the housing slant portion 211 may increase in a direction toward the right side.

Owing to this structure of the present disclosure, at least one electrode lead 111 may be easily placed along the slant surface of the housing slant portion 211. That is, since downward force may be continuously applied to the electrode lead 111 due to gravity, when the electrode lead 111 is placed on an upper surface of the housing slant portion 211, the electrode lead 111 may be more stably brought into tight contact with the housing slant portion 211 by gravity. Therefore, since the electrode lead 111 is more stably held in the insulation housing 210, although the electrode lead 111 is vibrated or impacted, the electrode lead 111 may not be damaged, and two electrode leads 111 brought into contact with each other may be effectively prevented from being separated from each other.

In addition, electrode leads of at least some of the secondary batteries may have bent portions having a downwardly recessed shape.

For example, as indicated by G in FIG. 6, the electrode leads 111 of some secondary batteries 110 may extend in a horizontal direction and may be bent in a U-shape in a predetermined portion.

According to this structure of the present disclosure, lateral shocks may be absorbed by the bent portions having a downwardly recessed shape. That is, when the battery module is impacted or vibrated in a direction from outside (right in FIG. 6) to inside (left in FIG. 6), transmission of shocks or vibrations to main bodies of the secondary batteries through the electrode leads may be reduced owing to the bent portions. Therefore, the electrode leads of the secondary batteries may not be damaged by external shocks or vibrations.

In particular, as shown in FIGS. 5 and 6, a bent portion G may be formed on at least one of two electrode leads brought into contact with each other with a cartridge being placed therebetween. For example, an upper one of two electrode leads brought into contact with each other with a cartridge being therebetween may have a bent portion. In this case, a lower electrode lead may be sloped along the housing slant portion 211. In addition, the bent portion of the upper electrode lead may be placed on a sloped portion of the lower electrode lead.

Therefore, in this case, an effect of placing the upper electrode lead on the housing slant portion like the lower electrode lead may be obtained, and thus the upper electrode lead may be more reliably brought into tight contact with the insulation housing and fixed to the insulation housing. In addition, the upper and lower electrode leads may be more reliably brought into tight contact with each other and maintained in contact with each other.

In addition, as illustrated in FIG. 5, when four or more secondary batteries are vertically stacked, bent portions of electrode leads may be located in every other layer, that is, in even or odd layers. However, the positions of bent portions may vary according to arrangement of the penetration holes or the secondary batteries.

In addition, the housing slant portion 211 may have a flat upper end portion. That is, as shown in FIG. 6, the height of the housing slant portion 211 may increase in a direction toward the right side, and in this case, a right upper end portion of the housing slant portion 211 may be bent to form a flat surface. In this case, an electrode lead 111 may be sloped upward along the housing slant portion 211 and may then be flat along the upper flat surface, and thus the electrode lead 111 may not be excessively bent when being brought into contact with the sensing bus bar 220.

In addition, in the sensing assembly 200 of the battery module of the present disclosure, the insulation housing 210 may further include an outer horizontal portion 212.

The outer horizontal portion 212 may extend flat from a lower end of the housing slant portion 211 in an outward horizontal direction. In this case, the outer horizontal portion 212 and the housing slant portion 211 may be formed in one piece. In particular, the outer horizontal portion 212 may extend to an upper end of a penetration hole. In this case, upper and lower ends of penetration holes of the insulation housing 210 may be defined by the outer horizontal portion 212 and the housing slant portion 211. That is, the outer horizontal portion 212 of the insulation housing 210 may form the upper end of a penetration hole, and an upper end of the housing slant portion of the insulation housing 210 may form a lower end of a penetration hole.

According to this structure of the present disclosure, the cell assembly 100 and the sensing assembly 200 may be more easily coupled to each other, and movement of the electrode lead 111 may be more effectively prevented. That is, when the sensing assembly 200 is coupled to the cell assembly 100, the outer horizontal portion 212 guides an electrode lead 111 in an outward horizontal direction, and thus the electrode lead 111 may easily inserted through a penetration hole. Furthermore, in a state in which the sensing assembly 200 is coupled to the cell assembly 100, the electrode lead 111 is constrained from moving upward, and thus the electrode lead 111 may not be severely moved, damaged, or separated when being vibrated or impacted. Therefore, in this case, the occurrence of a power insensitive phenomenon or a decrease in the power or capacity of the battery module may be prevented when the battery module is vibrated or impacted. In addition, since movement of the electrode lead 111 is constrained by the outer horizontal portion 212, electrode leads 111 that should not be brought into contact with each other may not be brought into contact with each other. Therefore, in this case, problems such as an internal short circuit caused by improper contact between electrode leads 111 may be prevented.

In addition, according to the structure of the present disclosure, the battery module does not need to have parts such as an additional lead cover for limiting upward movement of electrode leads 111, thereby improving the assemblability of the battery module and reducing the manufacturing costs and time of the battery module.

Figure 7:
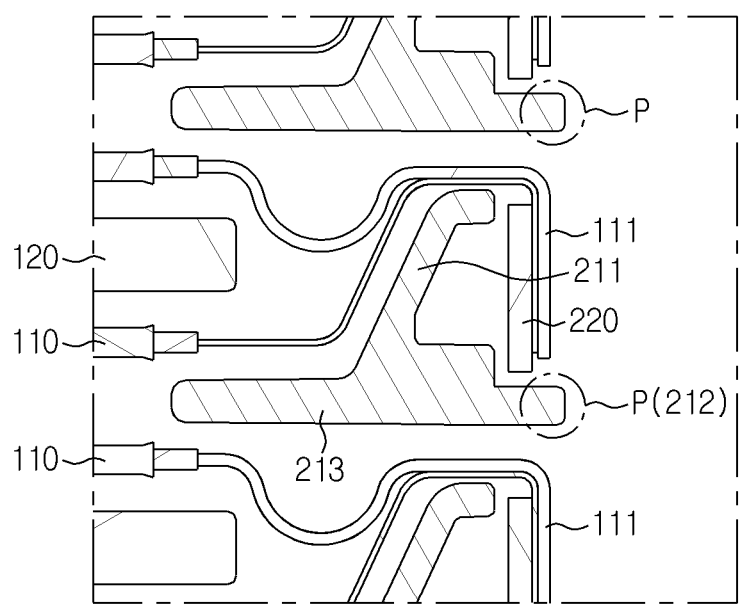
FIG. 7 is a cross-sectional view schematically illustrating a partial configuration of a sensing assembly according to another embodiment of the present disclosure.

FIG. 7 is a cross-sectional view schematically illustrating a partial configuration of a sensing assembly 200 according to another embodiment of the present disclosure. FIG. 7 illustrates an embodiment of the cross-section taken along line A1-A1' of FIG. 3 which may be different from that shown in FIG. 6. Differences from the previous embodiment will be mainly described with reference to FIG. 7, and detailed descriptions of parts similar to those described above will be omitted.

Referring to FIG. 7, an outer horizontal portion 212 may protrude outward with respect to a sensing bus bar 220. For example, in the structure shown in FIG. 7, the outer horizontal portion 212 may extend and protrude rightward from the sensing bus bar 220 as shown in a region indicated by P.

According to this structure of the present disclosure, improper contact between electrode leads 111 may be more securely prevented by the outer horizontal portion 212. For example, in the structure shown in FIG. 7, outer horizontal portions 212 may be located above and below an electrode lead 111 brought into contact with an outer surface of the sensing bus bar 220. Therefore, a lower end portion of a pair of electrode leads 111 bent downward may be securely prevented from making contact with a lower pair of electrode leads 111 owing to a protrusion portion P of an outer horizontal portion 212 located below the lower end portion of a pair of electrode leads 111. In addition, even if some electrode leads 111 are separated upward due to breakage of welds, the electrode leads 111 may be securely prevented from making contact with upper pairs of electrode leads 111 or the upper bus bar owing to protrusion portions P of the outer horizontal portions 212 located above the electrode leads 111.

In addition, according to this structure of the present disclosure, upward movement of an electrode lead 111 may be securely prevented by the protrusion portion P of the outer horizontal portion 212. In addition, according to the structure, the sensing bus bar 220 may rest on the protrusion portion P of the outer horizontal portion 212. Therefore, the sensing bus bar 220 and an insulation housing 210 may be more easily coupled to each other and more easily maintained in the coupled state.

In addition, preferably, the sensing bus bar 220 may be configured such that an empty space may be formed between the sensing bus bar 220 and an outer side of the housing slant portion 211. That is, the sensing assembly 200 may be configured such that an empty space may be formed between the sensing bus bar 220 and the insulation housing 210.

For example, as shown in FIG. 6, the sensing bus bar 220 may be located outside the housing slant portion 211 in a standing posture approximately perpendicular to the ground. In this case, an upper end of the sensing bus bar 220 may be in contact with and supported by the upper end of the housing slant portion 211, and a lower end of the sensing bus bar 220 may be in contact with and supported by an outer end of the outer horizontal portion 212. In addition, an empty space may be formed between the sensing bus bar 220 and the housing slant portion 211 as indicated by V in the drawing.

According to the structure of the present disclosure, the sensing bus bar 220 may be horizontally placed on the insulation housing 210 and stably supported by the insulation housing 210, and in addition to this, an empty space may be formed between the sensing bus bar 220 and the insulation housing 210. The empty space may facilitate discharge of heat or gas when the sensing bus bar 220 and electrode leads 111 are welded together and electrode leads 111 are welded together, and may prevent thermal deformation of the insulation housing 210.

That is, welding such as laser welding may be performed between the sensing bus bar 220 and an electrode lead 111, and between two electrode leads 111, so as to fixedly maintain contact therebetween. In this case, heat may be generated in large amounts during the welding, but the empty space may decrease the amount of heat transferred to the insulation housing 210, thereby decreasing deformation of the insulation housing 210 and the generation of gas. Therefore, the insulation housing 210 is prevented from being damaged or weakened, and the sensing bus bar 220 may be stably fixed to the insulation housing 210.

In addition, owing to this structure, connection between electrode leads and between electrode leads and the bus bar may be stably maintained. Furthermore, gas may be generated when the sensing bus bar 220 and the electrode leads 111 are welded together, and if the gas is not properly discharged, defects may be formed at welding portions between the sensing bus bar 220 and the electrode leads 111 or between the electrode leads 111. However, owing to the empty space, gas may easily be discharged during welding, and thus weld defects caused by gas may be prevented.

In addition, the empty space between the sensing bus bar and the insulation housing may reduce the weight of the insulation housing, and thus the battery module may have a low weight.

In addition, preferably, an upper end of the sensing bus bar 220 may be lower than an upper end of the housing slant portion 211. For example, as indicated by D in FIG. 6, the height of the sensing bus bar 220 may be lower than the upper end of the housing slant portion 211.

According to this structure of the present disclosure, the electrode leads 111 may be prevented from being damaged by bending. That is, the electrode leads 111 horizontally inserted through the penetration holes of the insulation housing 210 are required to be bent about 90° so as to be brought into contact with the sensing bus bar 220 standing in a direction perpendicular to the ground. For example, in the structure shown in FIG. 6, an electrode lead 111 is required to be bent downward by about 90° after being inserted through a penetration hole. In this case, since the height of the upper end of the sensing bus bar 220 is lower than the height of the upper end of the housing slant portion 211, the electrode lead 111 may be more gently bent, and thus the electrode lead 111 may be more effectively prevented from being damaged at a bent portion. In addition, contact between the electrode lead 111 and the sensing bus bar 220 may be improved.

In the battery module of the present disclosure, the secondary batteries 110 may be pouch-type, unidirectional secondary batteries. Here, the term "unidirectional secondary battery" may refer to a secondary battery from which a positive electrode lead and a negative electrode lead protrude in one direction. For example, as shown in FIGS. 1 to 3, the secondary batteries may be configured such that all the positive and negative electrode leads protrude forward (to the upper side in the drawings). If such unidirectional secondary batteries are vertically arranged in a laid-down posture, as many electrode leads 111 as the number of stacked secondary batteries may be vertically arranged in a state in which each of the secondary batteries includes a positive electrode lead and a negative electrode lead, and thus the plurality of electrode leads 111 may also be arranged in two columns in a horizontal direction.

In this structure, the plurality of penetration holes, a plurality of housing slant portions 211, and a plurality of sensing bus bars 220 may be vertically arranged and horizontally arranged in two columns in accordance with the arrangement of the electrode leads 111.

Preferably, the insulation housing 210 may further include an inner horizontal portion 213.

As illustrated in FIGS. 6 and 7, the inner horizontal portion 213 may extend flat from a lower end of the housing slant portion 211 in an inward horizontal direction. In this case, the inner horizontal portion 213 and the housing slant portion 211 may be formed in one piece. In particular, as indicated by E in FIG. 6, the inner horizontal portion 213 may extend until an inner end portion of the inner horizontal portion 213 is located between two adjacent cartridges 120. In addition, the inner horizontal portion 213 may be located between two secondary batteries that are adjacent to each other but are not connected to each other through electrode leads thereof. In this case, the inner horizontal portion may be located between the sealing portions of the secondary batteries, that is, between the pouch-type cases of the two secondary batteries.

According to this structure of the present disclosure, electrode leads 111 that should not be in contact with each other may be more stably separated from each other. For example, in the structure shown in FIG. 6 in which two secondary batteries B1 and B2 are accommodated between two vertically stacked cartridges 120, the two secondary batteries B1 and B2 may have different pairs of electrode leads 111 and may not be in contact with each other. In this case, the inner horizontal portion 213 may extend to a position between the two cartridges 120. In particular, the inner horizontal portion 213 may extend to a position between the sealing portions of the two secondary batteries B1 and B2 accommodated between the two cartridges 120 and may be inserted between the sealing portions. Therefore, two electrode leads 111 may be more stably maintained in a separated state, and thus even when the battery module is vibrated or impacted, the electrode leads 111 may be more effectively prevented from making contact with each other.

When a plurality of unidirectional secondary batteries that are vertically stacked are electrically connected in series with each other, positive and negative electrode leads of the unidirectional secondary batteries that are located in different layers are connected to each other. For example, a positive electrode lead of a secondary battery may be brought into contact with a negative electrode lead of a secondary battery placed above the secondary battery, and a negative electrode lead of the secondary battery may be brought into contact with a positive electrode lead placed below the secondary battery. Therefore, the cartridges 120 and/or the insulation housing 210 may have different structures in portions in which positive electrode leads are placed and portions in which negative electrode leads are placed. This will be described in more detail with reference to FIGS. 8 to 10.

Figure 8:
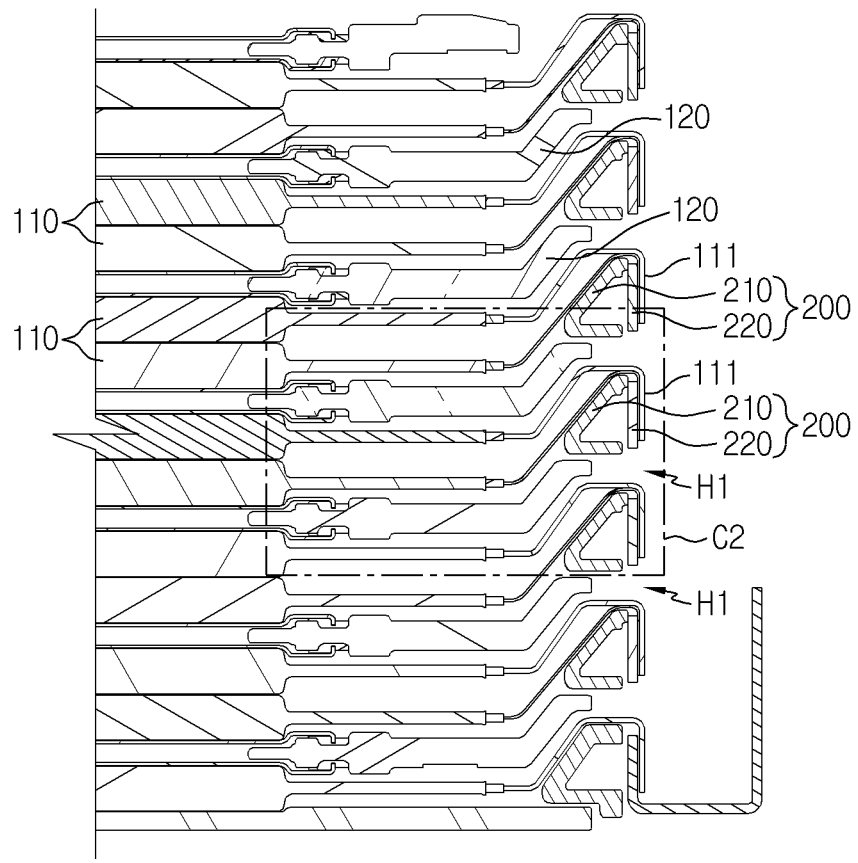
FIG. 8 is a cross-sectional view taken along line A2-A2' of FIG. 3.
Figure 9:
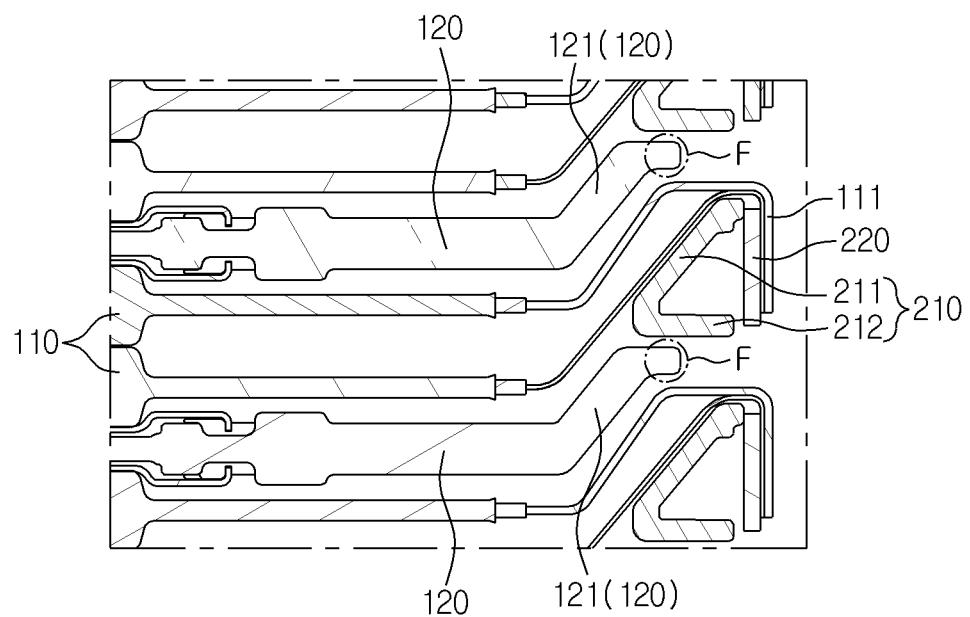
FIG. 9 is an enlarged view illustrating a portion C2 of FIG. 8.
Figure 10:
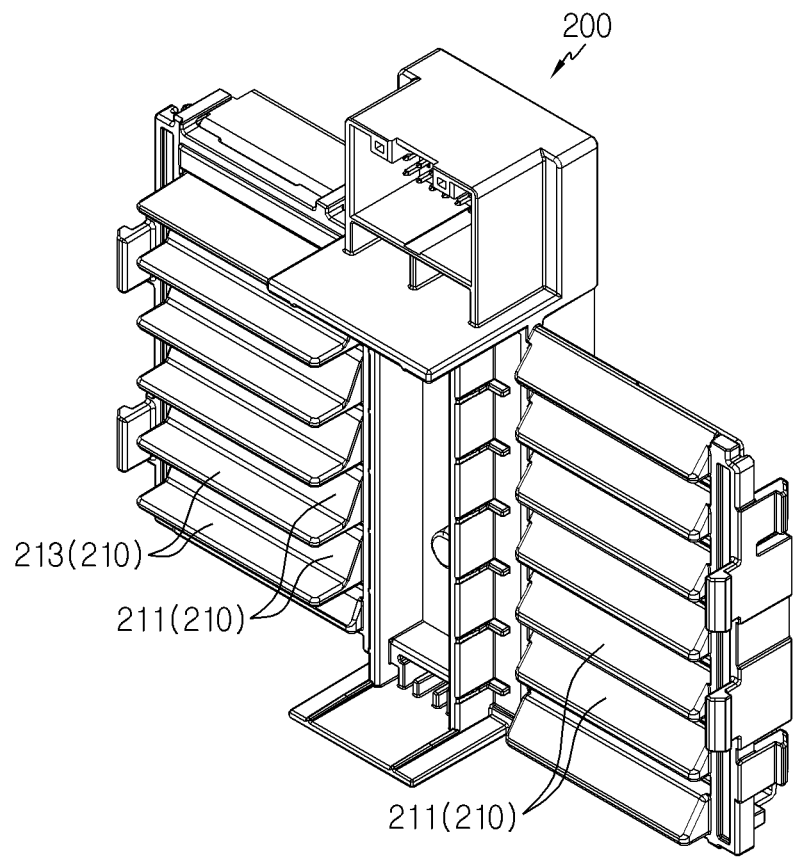
FIG. 10 is a perspective view illustrating, an insulation housing in a direction from inside to outside according to an embodiment of the present disclosure.

FIG. 8 is a cross-sectional view taken along line A2-A2' of FIG. 3, and FIG. 9 is an enlarged view illustrating a portion C2 of FIG. 8. FIG. 10 is a perspective view illustrating the insulation housing 210 in a direction from inside to outside according to an embodiment of the present disclosure.

First, referring to FIGS. 8 and 9, it can be understood that some structures of the cartridges 120 and the insulation housing 210 are different from those shown in FIG. 6. For example, in the same one cartridge 120, a portion at which a positive electrode lead is placed may be different from a portion at which a negative electrode lead is placed. In addition, the insulation housing 210 may also be differently configured in a portion in which a positive electrode lead is placed and a portion in which a negative electrode lead is placed.

In addition, as shown in FIG. 10, a plurality of penetration holes and a plurality of housing slant portions 211 of the insulation housing 210, and a plurality of sensing bus bars 220 may be vertically arranged in two columns, and in this case, the left and right columns may have different structures.

In particular, as shown in FIG. 9, the cartridges 120 may include a cartridge slant portion 121. The cartridge slant portion 121 may be sloped from an outer end portion of the cartridge 120 at a predetermined angle from a horizontal direction. That is, the cartridge 120 may be approximately flat in the horizontal direction and may then be sloped at the outer end portion of the cartridge 120 at a predetermined angle with the ground.

According to this structure of the present disclosure, the electrode leads may be more easily taken out through the penetration holes.

For example, in the structure shown in FIG. 9, electrode leads of two secondary batteries placed between two cartridges are both taken out through one penetration hole and are brought into contact with each other. Here, the electrode lead of a lower secondary battery is lower than a housing slant portion 211. In this case, the electrode lead of the lower secondary battery may be guided by the cartridge slant portion 121 such that the electrode lead may extend or may be bent in an upward direction, and then the electrode lead may be guided to the penetration hole by the housing slant portion 211 located above the cartridge slant portion 121. Therefore, electrode leads of two secondary batteries placed inside the cartridges and connected to each other may be smoothly guided to the penetration hole of the insulation housing.

In this case, the inclined angle of the cartridge slant portion 121 may be the same as or similar to the inclined angle of the housing slant portion 211. For example, the cartridge slant portion may have a slant surface sloped about 60° to about 70° from the ground. In particular, the slant surface (inner slant surface) of the cartridge slant portion 121 may be located in the same plane as the slant surface (inner slant surface) of the housing slant portion 211.

According to this structure of the present disclosure, when the sensing assembly 200 and the cell assembly 100 are assembled, the cartridge slant portion 121 and the housing slant portion 211 may not interfere with each other owing to the integrated structure, and thus electrode leads 111 may not be easily caught on a boundary between the cartridge slant portion 121 and the housing slant portion 211. Therefore, in this case, the electrode leads 111 may be easily guided to the penetration hole owing to the cartridge slant portion 121 and the housing, slant portion 211, and thus assemblability of the sensing assembly 200 and the cell assembly 100 may be improved.

In this structure, the cartridge slant portion may extend to a lower end of the insulation housing 210. That is, as shown in a portion F of FIG. 9 the cartridge slant portion 121 may make contact with or extend to a lower portion of the insulation housing 210. For example, as shown in the portion F, an outer (right) end portion of a cartridge may be located more outward (rightward) than an inner (left) end portion of the insulation housing. In particular, an outer end portion of the cartridge slant portion may be located more outward than an inner end portion of the housing slant portion. In this case, a gap between the cartridge and the insulation housing 210 may be minimized. Therefore, improper contact between electrode leads 111 may be prevented, and assembling of the electrode leads 111 may be more securely guided.

In addition, the cartridge may include a horizontally bent portion on an outer side of the cartridge slant portion.

For example, as shown in the portion F of FIG. 9, the horizontally bent portion having a horizontally flat shape may be provided on the right side of the cartridge slant portion, that is, on the outer end portion of the cartridge slant portion. The horizontally bent portion may be located between an outer horizontal portion 212 and a housing slant portion 211 adjacent to each other and may guide an electrode lead toward a penetration hole. In particular, owing to the horizontally bent portion of the cartridge, an electrode lead guided slantly to an outer upper side along an outer portion of the cartridge slant portion and an inner portion of the housing slant portion may be bent outward in a horizontal direction. Therefore, in this case, the electrode leads may be easily taken toward the penetration holes of the insulation housing.

In addition, as shown in FIG. 9, the insulation housing 210 may not include an inner horizontal portion 213. That is, according to the structure of the battery module shown in FIG. 9, the cartridge slant portion 121 provided on an outer end portion of the cartridge extends to a lower end of the housing slant portion 211 of the insulation housing 210, and the insulation housing 210 may not include the inner horizontal portion 213 shown in FIG. 6 or 7. The reason for this is that electrode leads 111 of two secondary batteries 110 accommodated between two cartridges are directly connected to each other in the structure shown in FIG. 9. That is, in the structure shown in FIGS. 6 and 7, two secondary batteries 110 accommodated between two cartridges adjacently stacked in a vertical direction are not directly connected to each other, and thus it is preferably that the inner horizontal portion 213 physically separate the electrode leads 111 of the two secondary batteries 110. However, in the structure shown in FIG. 9, two secondary batteries 110 accommodated between two cartridges adjacently stacked in a vertical direction are directly connected to each other, and thus the inner horizontal portion 213 for physically separating electrode leads 111 of the two secondary batteries 110 may not be necessary.

Therefore, in a portion in which electrode leads 111 of two secondary batteries 110 accommodated between two cartridges 120 are not directly in contact with and connected to each other, for example, in the cross-section taken along line A1-A1' of FIG. 3, the cartridges 120 may be entirely flat without a cartridge slant portion, and the insulation housing 210 may include the inner horizontal portion 213. However, in a portion in which electrode leads 111 of two secondary batteries 110 accommodated between two cartridges 120 are directly in contact with and connected to each other, for example, in the cross-section taken along line A2-A2' of FIG. 3, the cartridges may include cartridge slant portions, and the insulation housing 210 may not include the inner horizontal portion 213.

Figure 11:
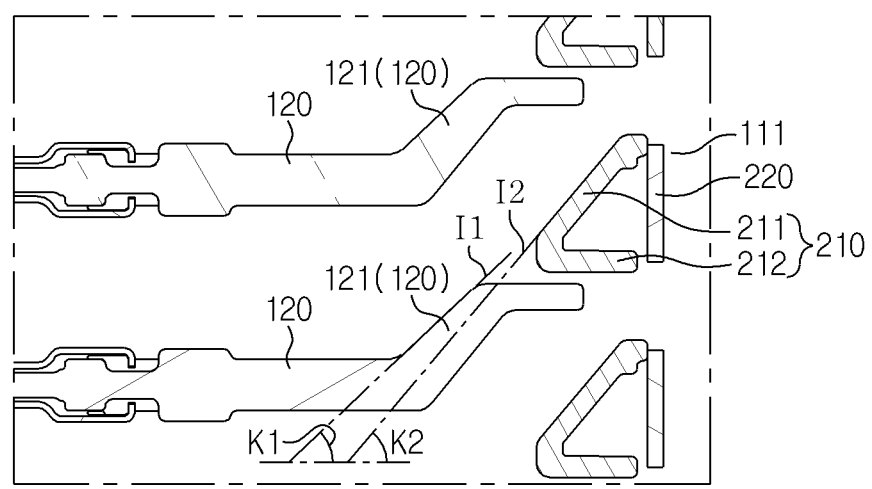
FIG. 11 is a view illustrating the portion C2 of FIG. 8 according to another embodiment.

FIG. 11 is a view illustrating the portion C2 of FIG. 8 according to another embodiment. In FIG. 11, secondary batteries are not illustrated for ease of description.

Referring to FIG. 11, a cartridge slant portion 121 may have an inner slant surface closer to the inside of the battery module than a housing slant portion 211. That is, as shown in FIG. 11, when a line segment extending along an inner slant surface of the housing slant portion 211 is referred to as a I2, the inner slant surface of the cartridge slant portion 121 may be located more leftward than the segment line I2, that is, at an inside position of the battery module.

According to this structure of the present disclosure, an electrode lead may first extend upward along the cartridge slant portion 121 located inside and may then be smoothly guided to the housing slant portion 211 without being caught on a boundary between the cartridge slant portion 121 and the housing slant portion 211. That is, referring to FIG. 11, an electrode lead extending and bent toward a right upper side along the cartridge slant portion may be smoothly guided to the housing slant portion located outside without being caught on a gap between the cartridge slant portion and the housing slant portion at an upper right end of the cartridge slant portion.

Therefore, in this case, the electrode lead may be more smoothly guided to a penetration hole, thereby further improving the assemblability of the cell assembly and the sensing assembly and preventing the electrode lead from being damaged.

In addition, the cartridge slant portion may have an inclined angle smaller than that of the housing slant portion.

For example, in FIG. 11, a line segment extending along the inner slant surface of the cartridge slant portion 121 is referred to as I1, a line segment extending along the inner slant surface of the housing slant portion 211 is referred as I2, an angle between I1 and the ground is referred to as K and an angle between I2 and the ground is referred to as K2. In this case, K1 may be smaller than K2. For example, in the structure shown in FIG. 11, K1 may be 35°, and K2 may be 45° greater than K1.

In this structure of the present disclosure, an electrode lead may be more smoothly guided to a penetration hole without being damaged. In particular, if an electrode lead is bent at one time by an excessively large angle, the electrode lead may not be bent in a desired shape and may be damaged. However, according to the above-described embodiment, an electrode lead may be first bent to a small angle by the cartridge slant portion 121 and may be secondarily bent to a relatively large angle by the housing slant portion 211. Therefore, an electrode lead may be more smoothly guided to a penetration hole along the cartridge slant portion and the housing slant portion, and the electrode lead may be prevented from being excessively bent and damaged.

Figure 12:
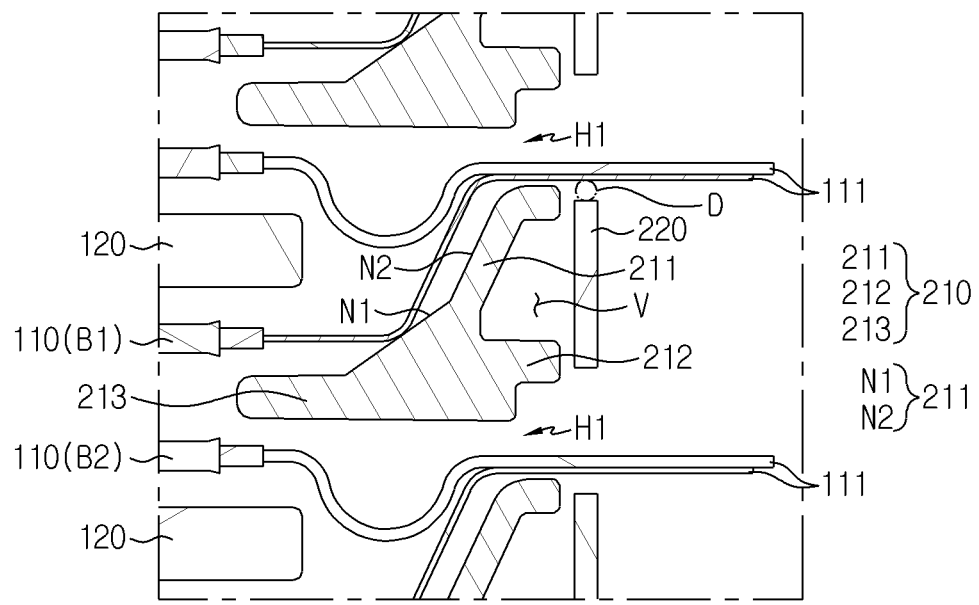
FIG. 12 is a view illustrating the portion C1 of FIG. 5 according to another embodiment.

FIG. 12 is a view illustrating the portion C1 of FIG. 5 according to another embodiment. For example, FIG. 12 may illustrate a modification of that shown in FIG. 6 or 7.

Referring to FIG. 12 a housing slant portion 211 may include two ore more slant portions having different inclined angles. For example, as shown in FIG. 12, the housing slant portion 211 may include a first slant portion N1 located relatively inside (the left side in the drawing), and a second slant portion N2 located relatively outside (the right side in the drawing). In this case, the first slant portion N1 may have an inclined angle smaller than that of the second slant portion N2. For example, an angle between the first slant portion N1 and the ground may be 40°, and an angle between the second slant portion N2 and the ground may be 70°.

According to this structure of the present disclosure, an electrode lead may be more smoothly guided and may not be damaged. In particular, if an electrode lead is bent at one time by an excessively large angle, the electrode lead may not be bent in a desired shape and may be damaged. However, according to the above-described embodiment, an electrode lead may be first bent to a small angle by the first slant portion N1 and may then be bent to a relatively large angle by the second slant portion N2. Therefore, the electrode lead may be smoothly bent toward a penetration hole, that is, toward an right upper side, and since the electrode lead is not excessively bent, the electrode lead may not be damaged.

In addition, the structure in which two or more slant portions having different inclined angles are provided may be applied to the cartridge slant portion 121 in addition to the housing slant portion 211.

Figure 13:
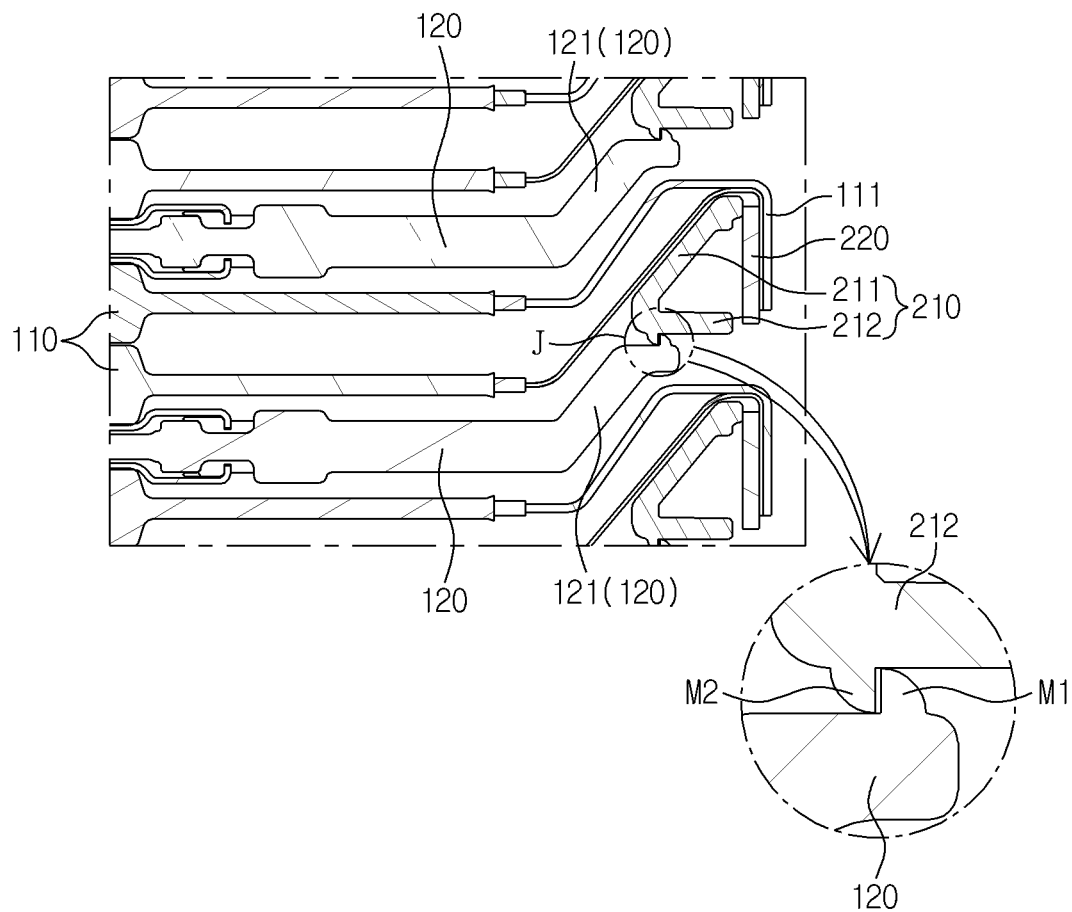
FIG. 13 is a cross-sectional view schematically illustrating a configuration of a cartridge and an insulation housing according to another embodiment of the present disclosure.

FIG. 13 is a cross-sectional view schematically illustrating a configuration of a cartridge and an insulation housing according to another embodiment of the present disclosure. For example, FIG. 13 may illustrate another embodiment of the portion C2 of FIG. 8.

Referring to FIG. 13, an insulation housing 210 and a cartridge 120 may be in contact with each other. For example, as shown in FIG. 13, a lower surface of an outer horizontal portion 212 may be in contact with at least a portion of an upper surface of a cartridge slant portion 121 (an upper surface of a horizontally bent portion).

In this case, a gap between the insulation housing 210 and the cartridge 120 is removed or reduced, and thus an electrode lead may not be caught in the gap. Furthermore, in this case, the insulation housing may constrain the cartridge from moving upward, and the cartridge may constrain the insulation housing from moving downward. Therefore, coupling between the cartridge and the insulation housing may be improved, and externally applied force may be uniformly distributed for safety against shocks or vibrations.

In addition, the cartridge and the insulation housing may be coupled to each other. For example, as shown in a portion J of FIG. 13, the cartridge 120 and the insulation housing 210 may include protrusions for being hooked to each other. That is, the insulation housing 210 may include a hook protrusion M2 protruding downward from a lower portion of the outer horizontal portion 212. In addition, the cartridge 120 may include a hook protrusion M1 protruding upward from an upper portion of an outer end flat portion (horizontally bent portion) of a cartridge slant portion. Therefore, when the cell assembly and the sensing assembly are assembled, the hook protrusion M1 of the cartridge and the hook protrusion M2 of the insulation housing may be coupled to each other.

In this case, the hook protrusion M1 of the cartridge is positioned outside the hook protrusion M2 of the insulation housing such that the insulation housing may not be separated in an outward direction. Therefore, according to this embodiment, coupling between the insulation housing and the cartridge may be improved. In particular, all cartridges may include hook protrusions M1 and hook protrusions M2 corresponding to the hook protrusions M1 may also be provided on all outer horizontal portions 212 of the insulation housing. In this case, all the cartridges may be securely fixed to the insulation housing, and thus the cell assembly and the sensing assembly may be much more securely fixed to each other. In particular, even when some center cartridges of the cartridges of the battery module are impacted in a direction from outside to inside, since all the cartridges are maintained fixed to the insulation housing, all the cartridges may be stably maintained against shocks.

In this structure, an outer portion of the hook protrusion M1 of the cartridge may be sloped downward in an outward direction (rightward in the drawing), and an inner portion of the hook protrusion M1 may be perpendicular to the ground. On the other hand, an inner portion of the hook protrusion M2 of the insulation housing may be sloped downward in an outward direction, and an outer portion of the hook protrusion M2 may be perpendicular to the ground. In this case, the hook protrusions may be smoothly coupled to each other and may then be not easily separated from each other.

Figure 14:
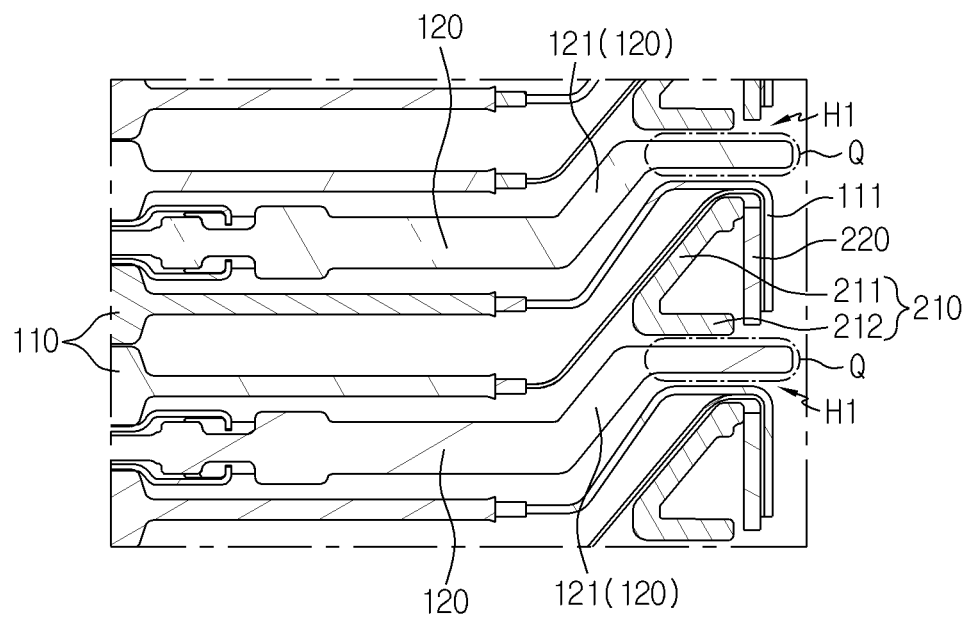
FIG. 14 is a cross-sectional view schematically illustrating a configuration of a cartridge and an insulation housing according to another embodiment of the present disclosure.

FIG. 14 is a cross-sectional view schematically illustrating a configuration of a cartridge and an insulation housing according to another embodiment of the present disclosure. For example, FIG. 14 may illustrate another embodiment of the portion C2 of FIG. 8.

Referring to FIG. 14, as shown in a portion Q, a horizontally bent portion formed on an outer end portion of a cartridge slant portion 121 may penetrate a penetration hole H1 of the insulation housing and protrude outward. That is, a cartridge 120 may extend toward an outer upper side along, a cartridge slant portion 121, and may then extend horizontally from a predetermined position in an outward direction until an end portion of the cartridge 120 is located outside a housing slant portion 211. In particular, the horizontally bent portion Q of the cartridge may be located below a sensing bus bar 220 and an electrode lead 111 and may protrude outward (rightward in the drawing) from the sensing bus bar 220 and the electrode lead 111.

According to this structure of the present disclosure, the electrode lead may be more smoothly guided to the penetration hole H1 along the horizontally bent portion Q of the cartridge. Furthermore, in this case, contact between electrode leads and/or bus bars located in different layers may be more reliably prevented owing to the horizontally bent portion.

As shown in FIGS. 1 to 3, the battery module of the present disclosure may further include an inlet duct 131 and an outlet duct 132.

Here, the inlet duct 131 may function as a space and path provided on an opened portion of a cooling path of the cartridges 120 to introduce a fluid into the cooling path. In addition, the outlet duct 132 may function as a space and path provided on another opened portion of the cooling path of the cartridges 120 to discharge the fluid to the outside of the battery module after the fluid passes through the cooling path. In addition, according to an embodiment of the present disclosure, the cartridges 120 of the cell assembly 100 may include openings that are located at left and right sides of the cartridges 120 and form end portions of the flow path, and the inlet duct 131 and the outlet duct 132 may be provided on the sides in which the openings are formed. In addition, the inlet duct 131 and/or the outlet duct 132 may include a fan for smooth introduction and discharge of a cooling fluid.

A battery pack of the present disclosure may include at least one battery module of the present disclosure. In addition to the battery module, the battery pack of the present disclosure may further include a pack case for accommodating the battery module and devices for controlling charge and discharge operations of the battery module such as a battery management system (BMS), a current sensor, or a fuse.

The battery module of the present disclosure may be applied automobiles such as electric vehicles or hybrid vehicles. That is, an automobile of the present disclosure may include the battery module of the present disclosure. In particular, even when the battery module of the present disclosure is impacted or vibrated, contact between electrode leads 111 may be stably maintained. Therefore, the safety of the automobile including the battery module may have markedly improved.

While some embodiments of the present disclosure has been described with reference to the accompanying drawings, it should be understood that the embodiments are given by way of illustration only, and various changes and modifications within the scope of the disclosure as defined by the appended claims will become apparent to those skilled in the art.

What is claimed is:

1. A battery module comprising:
   a cell assembly comprising a plurality of secondary batteries and a plurality of cartridges, the secondary batteries being vertically arranged and comprising electrode leads, the cartridges being vertically stacked to accommodate the secondary batteries in an inner space thereof; and
   a sensing assembly mounted on a front side of the cell assembly and comprising an insulation housing formed of an electrically insulative material and a sensing bus bar formed of an electrically conductive material, the sensing assembly being coupled to the electrode leads so as to sense voltages of the secondary batteries,
   wherein the insulation housing comprises a plurality of penetration holes vertically spaced apart from each other to allow the electrode leads to penetrate therethrough, and a plurality of housing slant portions arranged in the penetration holes and sloped at a predetermined angle from a horizontal direction, and
   wherein the cartridges overlap the insulation housing in the vertical direction.

2. The battery module of claim 1, wherein the housing slant portions have a height decreasing in an inward direction toward the cell assembly.

3. The battery module of claim 1, wherein the insulation housing further comprises outer horizontal portions extending from lower ends of the housing slant portions in an outward horizontal direction.

4. The battery module of claim 3, wherein the outer horizontal portions protrude outward with respect to the sensing bus bar.

5. The battery module of claim 1, wherein the sensing bus bar is located outside the housing slant portions to form an empty space between the sensing bus bar and the housing slant portions.

6. The battery module of claim 1, wherein the plurality of penetration holes, the plurality of housing slant portions, and a plurality of sensing bus bars are vertically arranged in two columns in a horizontal direction.

7. The battery module of claim 1, wherein the insulation housing further comprises an inner horizontal portion extending toward the cell assembly from a lower end of each of the housing slant portions such that an inner end portion of the inner horizontal portion extends in an inward horizontal direction toward the cell assembly.

8. The battery module of claim 1, wherein the cartridges comprise cartridge slant portions formed on end portions of the cartridges facing the cell assembly and sloped at a predetermined angle from the horizontal direction.

9. A battery pack comprising the battery module of claim 1.

10. An automobile comprising the battery module of claim 1.

11. The battery module of claim 8, wherein an angle of inclination of the cartridge slant portions is less than an angle of inclination of the housing slant portions.

12. The battery module of claim 8, wherein the insulation housing includes a plurality of horizontal portions, and
wherein the cartridge slant portions contact a bottom surface of the horizontal portions.

13. The battery module of claim 8, further comprising a horizontally bent portion extending from each of the cartridge slant portions, the horizontally bent portion protruding outwardly passed the sensing bus bar.

14. The battery module of claim 8, wherein the cartridge slant portions have two different angles of inclination.

15. The battery module of claim 1, wherein the insulation housing extends outwardly passed the electrode leads.

16. The battery module of claim 1, wherein the cartridges extend outwardly to overlap the insulation housing when view in the vertical direction.

* * * * *